United States Patent
Heng et al.

(10) Patent No.: US 7,302,671 B2
(45) Date of Patent: Nov. 27, 2007

(54) INTEGRATED CIRCUIT LOGIC WITH SELF COMPENSATING SHAPES

(75) Inventors: Fook-Luen Heng, Yorktown Heights, NY (US); Jin-Fuw Lee, Yorktown Heights, NY (US); Daniel L. Ostapko, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 307 days.

(21) Appl. No.: 11/097,552

(22) Filed: Apr. 1, 2005

(65) Prior Publication Data
US 2005/0189605 A1 Sep. 1, 2005

Related U.S. Application Data

(63) Continuation-in-part of application No. 10/787,488, filed on Feb. 26, 2004.

(51) Int. Cl.
*G06F 17/50* (2006.01)

(52) U.S. Cl. .......................................... 716/19; 716/20

(58) Field of Classification Search .................. 716/19, 716/18, 20
See application file for complete search history.

(56) References Cited

U.S. PATENT DOCUMENTS 6,871,338 B2 * 3/2005 Yamauchi ..................... 716/19

* cited by examiner

*Primary Examiner*—Hoai Pham
(74) *Attorney, Agent, or Firm*—Law Office of Charles W. Peterson, Jr.; Louis J. Percello, Esq.; Satheesh K. Karra, Esq.

(57) ABSTRACT

An integrated circuit (IC) including at least one combinational logic path. The features in the combinational logic path are self compensating for out-of-focus effects. In particular, field effect transistor (FET) gates may be iso-focally spaced such that the gate (critical dimension) may move with changing focus, but the gate length remains the same. Alternately, logic circuits in a path may self-compensate for focus effects on individual circuits.

13 Claims, 3 Drawing Sheets

INTEGRATED CIRCUIT LOGIC WITH SELF COMPENSATING SHAPES

CROSS REFERENCE TO RELATED APPLICATION

The present invention is continuation in part of U.S. patent application Ser. No. 10/787,488, entitled "INTEGRATED CIRCUIT LOGIC WITH SELF COMPENSATING BLOCK DELAYS" to Puneet Gupta et al., filed Feb. 26, 2004, and assigned to the assignee of the present invention.

FIELD OF THE INVENTION

The present invention generally relates to integrated circuits and more particularly to minimizing path delay variations in integrated circuits.

BACKGROUND DESCRIPTION

A typical integrated circuit (IC) chip includes a stack of several levels or sequentially formed layers of shapes. Each layer is stacked or overlaid on a prior layer and patterned to form the shapes that define devices (e.g., field effect transistors (FETs)) and connect the devices into circuits. In a typical state of the art complementary insulated gate FET process, such as what is normally referred to as CMOS, layers are formed on a wafer to form the devices on a surface of the wafer, e.g., a silicon surface layer of a silicon on insulator (SOI) wafer. A simple FET is formed by the intersection of two shapes, a gate layer rectangle on a silicon island formed from the silicon surface layer. Thus, physical characteristics of each individual FET in a circuit formed on the same chip of the same wafer depend, primarily, on these two shapes. In sensitive circuits that use matched or a balanced pair FETs such as sense amplifiers, relatively minor can erode signal margin, at best impairing performance. In critical logic paths such device variations can change signal arrival times, causing race conditions.

Each layer of shapes, also known as mask levels or layers, may be created or printed optically through well known photolithographic masking, developing and level definition, e.g., etching, implanting, deposition and etc. Regular mask shapes may be grouped into one of four types: line/space arrays, isolated lines, isolated spaces, and contact holes. Ideally, fabrication parameters applied to features on a particular layer to affect all types of features uniformly on that layer. Unfortunately, all feature types do not respond uniformly, e.g., to focus. For example, minimum pitch lines may widen (and spaces shrink) out-of-focus, while isolated lines get narrower. This dichotomy has become especially troublesome as image dimensions and especially, FET gate lengths have shrunk.

Typically, each level includes targets at a number of chip locations or sites and subsequent levels are aligned to these targets. These targets normally include structures for focus and each layer is aligned to a previous layer. The tool is typically focused (through a layer of photoresist) on the particular structure in a previous layer as well. Focus may depend on a number of factors. The focus may vary within the field of focus, i.e., features at the edge of the field print (e.g., die or wafer) somewhat differently than features in the center. A typical wafer exhibits some across the wafer thickness difference, causing a difference in depth of focus across the wafer. Also, while nearly uniform, the photoresist layer thickness may be thicker/thinner at one point than others. Consequently, in-focus at the one point may be out-of-focus at others and vice-versa. Wear and tear on the stepping tool may result in site-to-site focus variations. Further, the variation may change and even become more pronounced as each layer is formed. Consequently, as features have shrunk, it has become increasingly difficult to control the Across Chip Linewidth Variation (ACLV).

So, since ACLV results in local as well as distributed gate length variations, designers are forced to increase design margins to compensate for/offset resulting variations. This is known as guard-banding and is normally effected with conservative device models to heavily guard-band a technology and add wide operating design margins. The effects of device variability on performance can be addressed/reduced with sophisticated statistical models to better describe the devices. Further, these effects can also addressed on a device by device basis by considering systematic device or circuit model variation. Regardless of the approach to address these variabilities, ACLV has increased data processing time to prepare guard-banded layouts in state of the art technologies for photo mask creation.

Thus, there is a need for reduced improved immunity to device layout sensitivity to focus variations.

SUMMARY OF THE INVENTION

It is a purpose of the invention to minimize focus variations in integrated circuit chip circuits;

It is another purpose of the invention to minimize circuit sensitivity to focus variations;

It is yet another purpose of the invention to reduce logic path focus sensitivity.

The present invention relates to an integrated circuit (IC) including at least one combinational logic path. The features in the combinational logic path are self compensating for out-of-focus effects. In particular, field effect transistor (FET) gates may be iso-focally spaced such that the gate (critical dimension) may move with changing focus, but the gate length remains the same. Alternately, logic circuits in a path may self-compensate for focus effects on individual circuits.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1A:
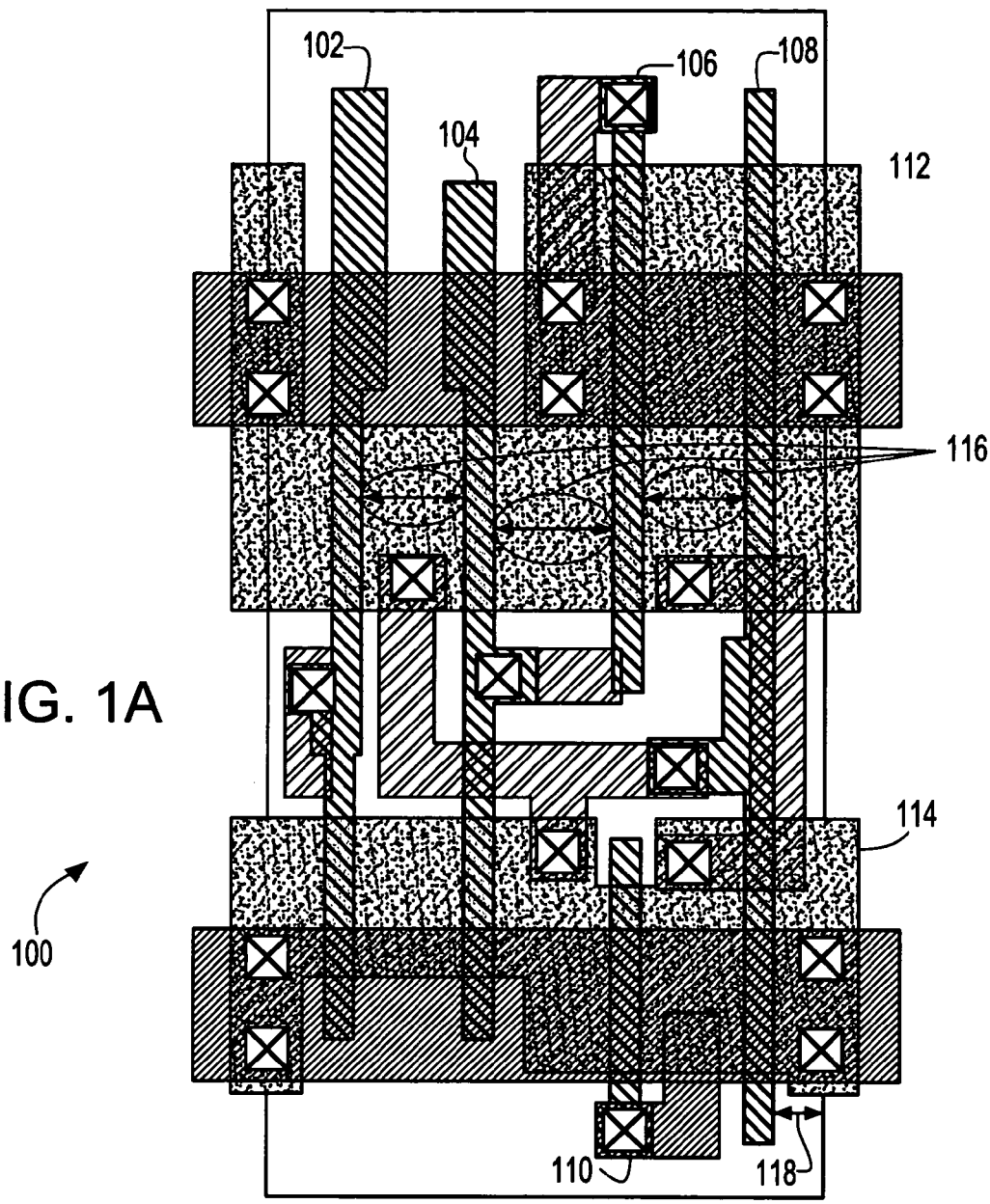
FIG. 1A shows an example of a preferred embodiment layout of a logic book according to the present invention.
Figure 1B:
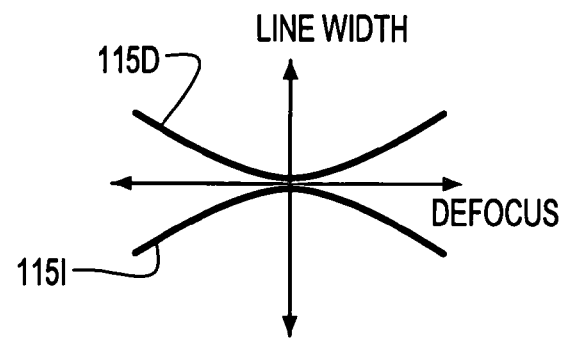
FIG. 1B is an example of a typical standard Bossung plot comparing line width versus defocus.

Turning now to the drawings and, more particularly, FIG. 1A shows an example of a physical design or layout of a logic book 100 with a transistor or device formed at the intersection of each of the device gate level (polysilicon) lines 102, 104, 106, 108, 110 with underlying diffusion/channel silicon island shapes 112, 114. FIG. 1B is an example of a typical standard Bossung plot comparing line width versus defocus for dense lines 115D and isolated lines 115I, showing how critical dimensions (CD) for each varies inversely with respect to the other. Thus according to a preferred embodiment of the present invention, instead of locating gates at a minimum pitch or a wide spacing, polysilicon lines 102, 104, 106, 108, 110 are located to self-compensate for CD 116, 118 variations.

So, in logic book 100, for example, after physical design (layout) critical dimensions are identified for individual devices. When the spacing between adjacent lines varies (i.e., is not uniform or the adjacent lines lie out of the proximity of each other), the through-focus critical dimension variation for each particular line is a function of the spacing to the left and the right. Accordingly, by alternately spacing lines isolated and dense or there between, each line self-compensates with its neighbors. So in this example, lines 102, 104, 106, 108, 110 defining the transistor gates are located with respect to each other to self-compensate. Right/left CD spacings are selected guided by manufacturing information to minimize individual device sensitivity to focus variation, i.e., to self-compensate. Such self compensation may be selected such that CDs remain constant even out of focus or, such that a change in one CD is offset by an equivalent opposite change in another. This is especially useful for larger signal paths that may be formed from a number of previously designed books. Advantageously, in each device, book or signal path, process variations are self-compensating according to the present invention. It should be noted that although described herein, primarily, with reference to layouts for basic cells, the present invention has application in layouts for self-compensating larger custom blocks, e.g. complex signal paths.

Figure 2:
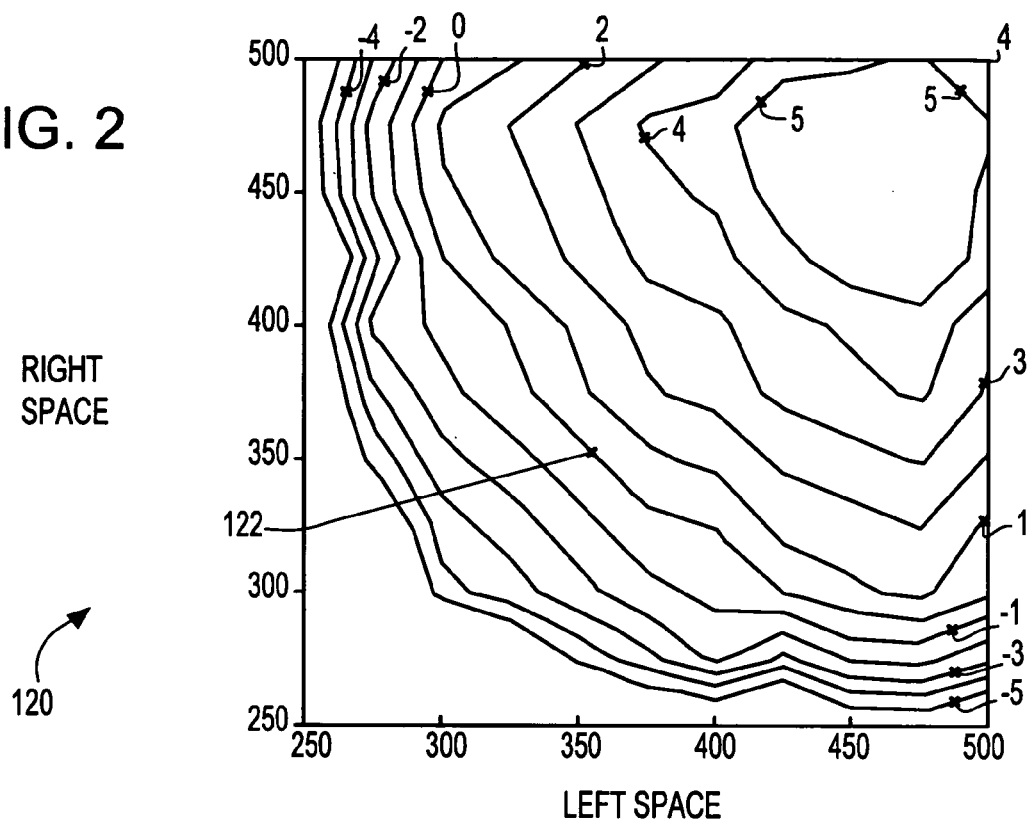
FIG. 2 shows an example of a focus sensitivity plot for a technology example that may be used in designing self compensating devices, books or signal paths.

FIG. 2 shows a CD focus sensitivity plot 120 for a technology example that may be used in designing self compensating devices, books or signal paths. In this particular example, plot 120 shows through-focus line width variation. Each contour represents a corresponding critical dimension variation ($\Delta CD$), indicated in nanometers (nm). Plot 120 of this example depicts $\Delta CD$ with respect to the left and right spacing of a device for a binary mask technology. So, as is apparent from plot 120, when the mask is printed out-of-focus lines with $\Delta CD>0$ thicken, while denser lines with $\Delta CD<0$ narrow. However, the $\Delta CD=0$ contour shows self-compensating separations for maintaining the CD for a device, i.e., where the device moves with CD fixed. A single point 122 on the $\Delta CD=0$ contour with same spacing for both neighbors, in this example at (354, 354) left and right, indicates the iso-focal separation point at which adjacent lines are equally spaced and the CD remains constant, i.e., is relatively independent of focus. Typically, the iso-focal separation is larger than the minimum design space for the particular level. Where the spacing between critical dimensions is much less important than maintaining the critical dimensions themselves; other points on this contour may be selected, i.e., those points corresponding to right and left spacings that also produce a fixed CD, but shifting (with the focus) location.

So according to the present invention, each line is spaced with respect to adjacent/neighboring lines by design such that for a particular line, focus variations from one neighbor on one side are offset by opposite effects from the other neighbor on the opposite side of the line. For each particular shape, either the critical dimension and the location of the shape remain fixed, i.e., the shape and its neighbors are iso-focal; the shape location changes (the shapes shift to one side because the spacing narrows on that side and widens on the other), while the critical dimension (e.g., FET gate length) remains fixed; or, the shapes vary (some FETs get shorter and some longer) but timing related variations null out for the entire path, i.e., the sum of both focus-related timing variations and corresponding critical dimensions along all input to output paths remains constant.

Thus, the book 100 of FIG. 1 shows an example of the first case, where all critical dimensions 116 are separated by the iso-focal distance and, further, by half of the iso-focal distance 118 from the cell boundaries. Two such books 100 lain side by side are also separated by the iso-focal distance (118+118). Advantageously, using preferred basic building blocks for larger circuits reduces the timing uncertainty for the entire circuit because focus-related timing variations are significantly reduced, if not substantially eliminated. Thus, critical delay paths may be designed for tighter tolerances because the circuit performance through such paths is stable over a range of process parameters.

Figure 3:
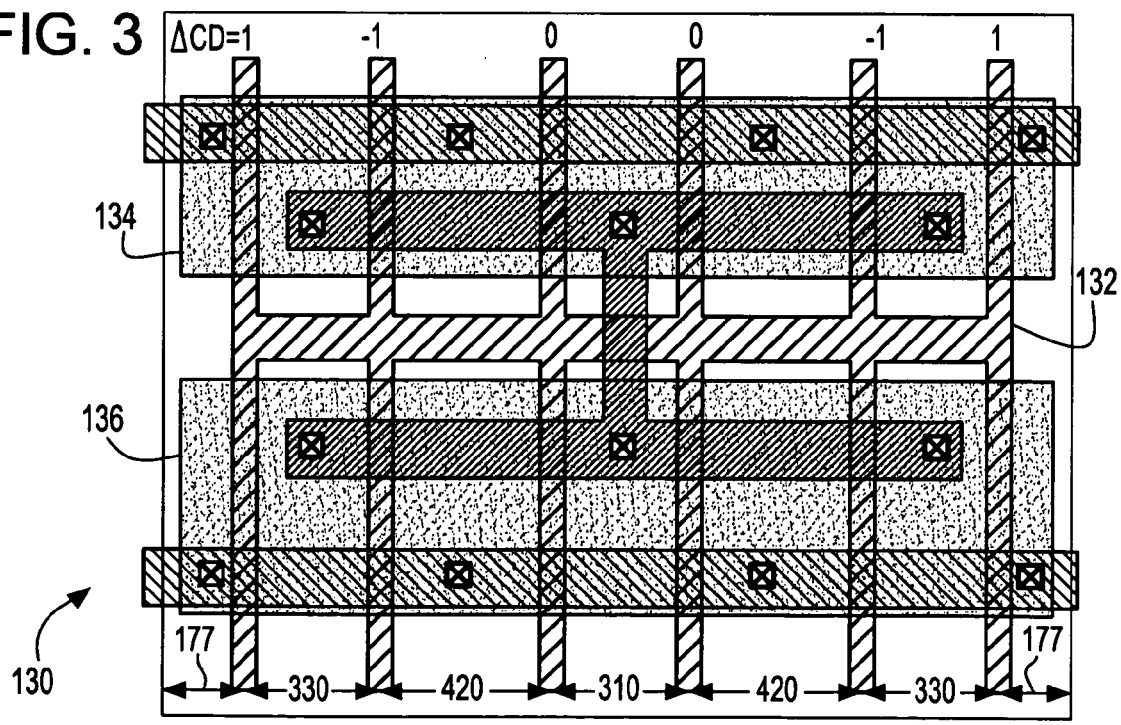
FIG. 3 shows an example of application of the present invention to a six fingered inverter with reference to the plot of FIG. 2.

FIG. 3 shows an example of application of the present invention (the second case) to a six fingered inverter 130 with reference to the plot 120 of FIG. 2, wherein the design performance is maintained for the inverter 130 independent of focus by offsetting polysilicon fingers (and gate defined by the fingers) such that an increase in one CD (i.e., one gate get longer) is accompanied by a corresponding decrease of the same amount in another CD (a neighboring gate gets shorter). The inverter 130 is formed as a dual six-fingered type polysilicon structure 132 intersects silicon islands 134, 136 to define PFET and NFET diffusion/channel regions, respectively, in the inverter 130. So for each finger, the position of a neighboring finger corresponding to a point on a $\Delta CD=+N$ contour is balanced by another neighboring finger positioned at the $\Delta CD=-N$ contour. This fingered structure provides, for example, a good offsetting approximation for two parallel devices or the worst case simultaneous switching of two devices in series. So, for this example with the finger (device gate) positions denoted by (space1, space2, $\Delta CD$), locating devices at (354, 330, +1), (330, 420, −1), (420, 310, 0), (310, 420, 0), (420, 330, −1), (330, 354, +1) provides a self compensated inverter 130 that is relatively insensitive to through-focus variation. Further, provided there is some freedom to choose points on the curves with different left and right spacing, the choice may accomplish some other optimization goal as well. For example, the output diffusion widths may be selected to minimize load diffusion capacitance (i.e. selecting the smaller iso-focal distances of 330, 310 and 330 as output nodes) for faster output switching with larger spaces at supply connections.

Figure 4:
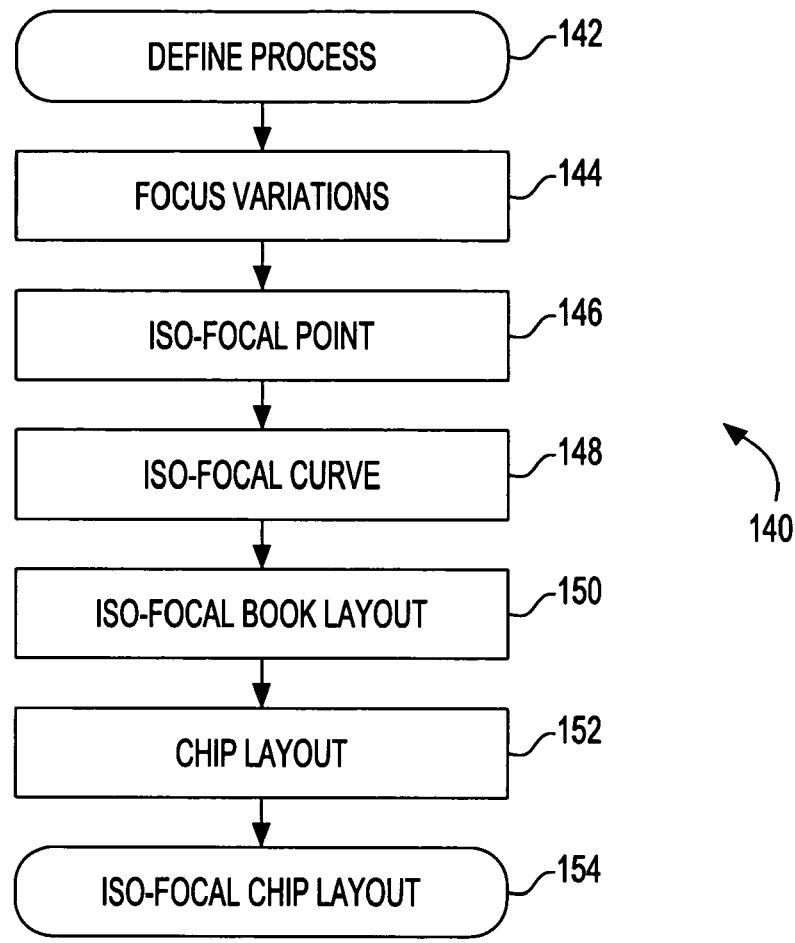
FIG. 4 shows a flow diagram showing the steps in designing circuits according to a preferred embodiment of the present invention.

FIG. 4 is an example of a flow diagram 140 showing the steps in designing circuits according to a preferred embodiment of the present invention. Once a process has been defined in step 142, in particular between physical design and shape formation, through-focus line width variation may be determined in step 144, algorithmically or heuristically. The through-focus line width variation may be provided, for example, in a standard Bossung plot of line width versus defocus condition such as the plot 120 of FIG. 2. From this plot 120, the iso-focal point may be determined in step 146 to select a balanced distance. Also, in step 148, the iso-focal curve is determined (typically coincident with iso-focal point determination step 146) for application on most remaining books and groups of individual devices where the layout rule of thumb is not practicable, e.g., across a complex book. Once the iso-focal point and curve have been determined, physical design begins in step 150 using the balanced distance as a layout rule of thumb to be followed where practicable, e.g., in book design. In those instances where the balanced distance is unsuitable, other points are selected from the iso-focal curve. Then, on more complex signal paths in step 152 where neither the iso-focal point nor the iso-focal curve provide acceptable self compensating results, e.g., because some devices are totally isolated and cannot be easily located within a desired distance of adjacent devices, offsetting ΔCD values are determined and distributed through the physical design. The resulting physical design 154 is a self-compensating layout.

Advantageously, a physical design according to the present invention does not suffer from the inherent problems and uncertainty normally associated with out-of-focus devices. Such a circuit is self-compensating for each device, gate or input to output signal path. Signal path delays are self-canceling to nullify any performance effects normally encountered with such variations. Further, the preferred self-compensating layout method 140 may be applied to a larger book, macro or circuit by selecting self-compensating spacing for a set of devices that are determined by selecting offsetting ΔCD values. In a simple example, in a sequence of serially connected gates, two of which are fingered devices, e.g., inverter 130, self compensation may be applied to the fingered devices, with fingers in one selected at the ΔCD=1 line and, the fingers in the other at ΔCD=−1.

Figure 5:
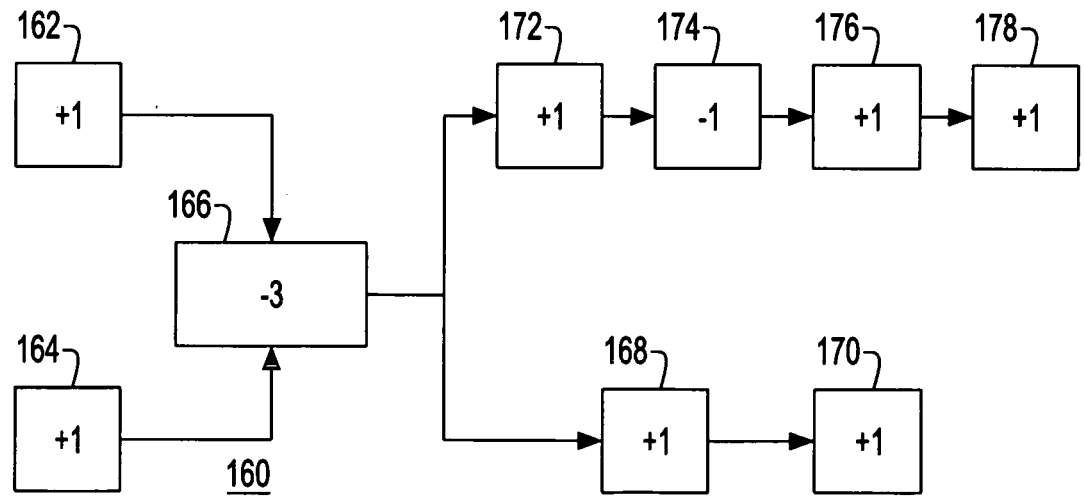
FIG. 5 shows a more complex example of combinational logic in a self-compensating cross section.

FIG. 5 shows a more complex example of combinational logic in a self-compensating cross section 160 according to a preferred embodiment of the present invention. The cross section 160, which may be on or part of an integrated circuit (IC) chip, includes logic blocks 162, 164, 166, 168, 170, 172, 174, 176, 178, e.g., standard cell logic gates or macros, selected to compensate each other for individual performance deviations from nominal. Each of the logic blocks 162, 164, 166, 168, 170, 172, 174, 176, 178 of this example are fingered blocks with compensation applied as indicated by the ΔCD value in the particular block. As can be seen from this example, each path, 162-170, 162-178, 164-170 and 164-178 results in zero sum for the ΔCD values of the path. Thus, an increase in one direction is offset by a reduction in the other.

Accordingly, focus variation effects may be minimized over a complex function by selecting compensating device spacing within the function, whether for random logic books (e.g., inverters, NAND gates, NOR gates and etc), macros (e.g., for an application specific integrated circuit (ASIC) chip), arrays, etc. Thus selecting these basic circuits for line pitch results in a self-compensating line width along the logic path and path delay from input to output as well. This self-compensation may be accomplished within each circuit or overall by using only iso-focal devices, by tailoring books with individually self-compensated transistors or by aggregating self compensating devices along a particular path. Further, because each device, book or signal path is self-compensating, the overall design performance uncertainty is reduced, which further recoups circuit performance that might be lost in guard banding of a traditional worst-case device modeling design approach. Additionally, devices, books, signal paths physically designed according to the present invention simplify data preparation (data-prep) for photo mask creation, thereby reducing data processing time.

While the invention has been described in terms of preferred embodiments, those skilled in the art will recognize that the invention can be practiced with modification within the spirit and scope of the appended claims. It is intended that all such variations and modifications fall within the scope of the appended claims.

What is claimed is:

1. An integrated circuit (IC) including at least one combinational logic path, said at least one combinational logic path comprising a plurality of logic circuits, devices in at least one circuit of said plurality of logic circuits being spaced from each other to self-compensate for focus variations.

2. An IC as in claim 1, wherein said devices in said at least one circuit are iso-focally spaced.

3. An IC as in claim 2, wherein said logic circuits are CMOS logic circuits, each comprising one or more field effect transistors (FETs), gates of ones of said FETs being iso-focally spaced.

4. An IC as in claim 3, wherein FET gates in said at least one of said CMOS logic circuits are uniformly spaced.

5. An IC as in claim 3, wherein FET gates in said at least one of said CMOS logic circuits are spaced with a wider spacing on one side than on another side, whereby when said at least one is printed, out-of-focus effects on said one side offsetting out-of-focus effects on said other side.

6. An IC as in claim 2, wherein said logic circuits are CMOS logic circuits, each comprising one or more field effect transistors (FETs) and, wherein said at least one combinational logic path is one of a plurality of signal paths, CMOS logic circuits in at least one other signal path self-compensating for each other.

7. An IC as in claim 6, wherein RET gates in at least one logic circuit are uniformly located on a pitch greater than an iso-focal distance and FET gates in at least one other logic circuit are at uniformly located a pitch less than said iso-focal distance, whereby when FET gates are printed, out-of-focus effects on gates in said at least one logic circuit are offset by out-of-focus effects on gates in said at least one other logic circuit.

8. A CMOS integrated circuit (IC) chip including at least one combinational logic path, said at least one combinational logic path comprising a plurality of logic circuits, gates of Field Effect Transistors (FETs) in at least one circuit of said plurality of logic circuits being spaced at a distance from each other to self-compensate for focus variations, said distance being larger than a defined minimum design space.

9. A CMOS IC chip as in claim 8, wherein said RET gates in said at least one circuit are iso-focally spaced.

10. A CMOS IC chip as in claim 9, wherein FET gates in said at least one of said CMOS logic circuits are uniformly spaced.

11. A CMOS IC chip as in claim 9, wherein FET gates in said at least one of said CMOS logic circuits are spaced with a wider spacing on one side than on another side, whereby when said at least one is printed, out-of-focus effects on said one side offset by out-of-focus effects on said other side.

12. A CMOS IC chip as in claim 9, wherein said at least one combinational logic path is one of a plurality of signal paths, logic circuits in at least one other signal path self-compensating for each other.

13. A CMOS IC chip as in claim 12, wherein FET gates in at least one logic circuit are uniformly located on a pitch greater than an iso-focal distance and FET gates in at least one other logic circuit are at uniformly located on a pitch less than said iso-focal distance, whereby when said FET gates are printed, out-of-focus effects on said FET gates in said at least one logic circuit are offset by out-of-focus effects on said FET gates in said at least one other logic circuit.

* * * * *